(12) United States Patent
Kunze-Concewitz (10) Patent No.: US 6,251,551 B1
(45) Date of Patent: Jun. 26, 2001

(54) METHOD AND DEVICE FOR TREATING TWO-DIMENSIONAL SUBSTRATES, ESPECIALLY SILICON SLICES (WAFERS), FOR PRODUCING MICROELECTRONIC COMPONENTS

(76) Inventor: Horst Kunze-Concewitz, Waldensor Strasse 41, D-75446 Wiernsheim (DE)

( * ) Notice: Subject to any disclaimer, the term of this patent is extended or adjusted under 35 U.S.C. 154(b) by 0 days.

(21) Appl. No.: 09/462,829

(22) PCT Filed: Jul. 1, 1998

(86) PCT No.: PCT/EP98/04049

§ 371 Date: Jan. 14, 2000

§ 102(e) Date: Jan. 14, 2000

(87) PCT Pub. No.: WO99/04416

PCT Pub. Date: Jan. 28, 1999

(30) Foreign Application Priority Data

Jul. 17, 1997 (DE) .............................................. 197 30 581

Jul. 17, 1997 (DE) .............................................. 197 30 582

(51) Int. Cl.⁷ ..................................................... G03F 9/00
(52) U.S. Cl. ................................................. 430/22; 430/30
(58) Field of Search .......................................... 430/22, 30

(56) References Cited

U.S. PATENT DOCUMENTS 5,468,302   11/1995   Thietje .

FOREIGN PATENT DOCUMENTS 0526 245   2/1993   (EP) .

*Primary Examiner*—Christopher G. Young (57) ABSTRACT

The invention concerns a method and a device for treating and processing flat substrates such as silicon slices (wafers) for producing microelectronic components in vertical alignment.

27 Claims, 13 Drawing Sheets

METHOD AND DEVICE FOR TREATING TWO-DIMENSIONAL SUBSTRATES, ESPECIALLY SILICON SLICES (WAFERS), FOR PRODUCING MICROELECTRONIC COMPONENTS

BACKGROUND OF THE INVENTION

The invention concerns a method and a device for treating and processing flat substrates, in particular silicon wafers, for the production of microelectronic components.

Substrates for microelectronic components e.g. silicon wafers require extremely clean surfaces necessitating repeated cleaning processes (treatments) during manufacture of a chip. The substrate must thereby be cleaned on both sides and at all surface locations. Among physical cleaning processes, wetting procedures are primarily used for single substrate cleaning comprising e.g. brushing, ultrasound, megasound, high-pressure and the like. The substrate must thereby be transported within the cleaning installation to the individual cleaning stations substantially in a wet condition. For single substrate processing, this is normally carried out in a horizontal substrate position using processing robots which e.g. hold the substrate at its lower side using vacuum or sideward clamping or through suitable bearing on transport belts, rollers and the like to facilitate transport. Contact with the surface during handling (both the front side as well as the back side) leads to contamination due to soiling (particles). In addition, the handling systems utilized in these extremely clean rooms are very complicated from a technical point of view and are expensive. The cleaning systems primarily used for the horizontal positioning of the substrate also require, for ever increasing substrate sizes, very large amounts of floor space in the clean rooms, which are consequently very expensive. In addition, collection of particles on the horizontal surfaces of the substrate also occurs in such clean rooms. The incidence of laminar guided clean room air containing residual particles on the large substrate surface leads to substantial contamination of the silicon wafers.

These processes also occur when cleaning rigid discs (metal substrates) or when producing microelectronic components generally referred to as chips on e.g. round silicon wafers using photolithographic processing, wherein the structures are exposed through masks on a photosensitive coating disposed on the surface of the substrate. The photosensitive coating (photo-resist) is thereby spun onto the substrate in a horizontal position, wherein subsequent processing, such as drying of the coating, exposure, development, etching and the like as well as the introduction of bonding agents prior to adding the coating are likewise all carried out in the horizontal substrate position. Handling between individual processing steps is effected using expensive handling robots capable of operation under clean room conditions.

Also known in the art is to spin dry individual wafers in the horizontal position following a wetting treatment. Very high rates of revolution are thereby required (in excess of 1000 to 5000 1/min), since the drops of water located on the wafer following the wetting processes are intrinsically very stable due to their surface tension and bond to the surface in the middle of the substrate. Only low centrifugal forces are active at the center of the substrate so that drying is only possible using very high rates of revolution to achieve sufficient forces in the middle of the substrate. This creates turbulence. Although such turbulence enhances drying, it also stirs-up particles causing contamination of the cleaned surface.

Other drying techniques, e.g. blowing nitrogen onto the middle of the substrate, also produce turbulence having the same effects. Additional warming of the surface (using infrared or laser techniques) can support the drying process. However, evaporation processes thereby occur which result in rinsing water residues in the form of drying spots on the surface of the substrate. These types of drying spots also constitute particles and are undesirable during production of the chips.

SUMMARY OF THE INVENTION

It is the underlying purpose of the invention to present a method and/or a device with which substrates of this type can be processed in an improved fashion and, in particular, less expensively.

This purpose is achieved in accordance with the invention with a method of the above mentioned kind, wherein the flat substrates, in particular silicon wafers, are aligned in such a fashion that the plane of the wafer is substantially vertical, with the wafers passing through at least one processing station in this (vertical) alignment. They thereby pass in vertical alignment into the processing station, are processed therein in vertical alignment, and also leave in vertical alignment. Although the wafers can be borne vertically in a transverse direction, they nevertheless maintain their vertical alignment.

The vertical alignment of the substrates or wafers leads to a substantial reduction in the relatively expensive clean room floor space and has the additional advantage that a substantially less amount of soiling particle deposit are incident on the surface of the wafers so that contamination in the clean room is accordingly reduced. In addition, installations of this type are substantially simpler and can be retrofitted to different wafer sizes.

The silicon wafers can be transported using handling robots. The wafers are thereby gripped on their edges using e.g. conical recesses on the robots.

For circular wafers, simple transport can be effected by passing the wafers pass through tilted processing stations under the force of gravity, in particular, by rolling. In this fashion, no separate transport device (handling robot) is required as a result of which the installation is relatively inexpensive. In particular, the wafers pass through a plurality of processing stations which are disposed one behind the other.

It is however also possible to effect substrate transport using guiding and/or transport rollers or transport elements which are disposed on a transport belt. Towards this end, the separation between the transport rollers or elements as well as the number and size thereof can be adjusted to the dimensions of the substrate to be processed or to the silicon wafers in such a fashion that as low as possible a bearing surface in the edge region of the substrate is effected on the transport rollers or elements.

The sideward guiding and thereby stabilization of the vertically aligned silicon wafers can be done without contact or in contact with the substrate surface, depending on requirements and processing techniques. For example, guiding without contact is possible during wetting processes effected by spray nozzles disposed on both sides of the substrate or guide rollers or guide strips wet with water or another liquid so that the substrate has surface contact only with the film of liquid or the liquid spray. Guiding using air or $N_2$ jets can be used for guiding without contact in drying processes. It is also possible to guide the substrate using air cushions generated between the substrate and the guide rollers or strips.

A contacted guiding can be effected using rollers or guide strips to guide the substrate in the edge region or at the sides.

The substrate must normally be turned for processing or handling procedures. This can be effected by lifting the substrate off the transport belt, wherein the substrate is pushed against drive rollers configured as rotational drive elements and engaging on one or two opposite sides of the silicon wafers to clamp same between themselves or between themselves and the transport roller or the roller of the lifting-off mechanism. Regulation of the clamping pressure can be effected using springs, resilient elements, pressure sensors or electronic means to which the drive rollers and/or the lift-off mechanisms are coupled. The transport roller itself can also be configured as a drive roller. The substrate can also be borne on the rotational drive by its intrinsic weight alone and held in vertical alignment using e.g. holding devices.

In order to achieve optimal handling processing results, the wafers are stopped and/or rotated during processing. They remain in the individual processing stations for a length of time sufficient for accomplishing the desired processing result.

Circular silicon wafers pass through the processing stations on their edges. A variation provides for integrating circular or non-circular wafers into circular adapters and passing them through the individual processing stations therewith.

The method can e.g. be a cleaning or drying process or even a photolithographic processing method, wherein cleaning fluids are introduced onto at least one and preferentially both sides of the silicon wafers.

The method can also be a spin drying method wherein, in addition to the (reduced) centrifugal force in the middle of the wafer, the force of gravity acts on the water droplets located in the middle of the substrate.

Towards this end, one can also introduce a gas-alcohol mixture into the processing station e.g. nitrogen with isopropanol to further reduce th e surface tension of the water. The centrifugal forces and the associated rate of revolution required for spin-off of the water can thereby be reduced to a further extent.

The above mentioned purpose is also achieved by a device for carrying out the above mentioned method, where in the processing station comprises a vertical inlet for the vertically aligned wafers, a transport path for the wafers in vertical alignment, and a vertical outlet. The transport path can comprise guide elements for guiding the wafers in vertical alignment. In addition, a slanted plane can e.g. also be used as a transport path (guiding track).

In the device in accordance with the invention, the wafers pass through the individual processing stations in vertical alignment so that the wafers can be processed on both sides. If evaporation or wetting processes are utilized e.g. during cleaning, when introducing a bonding agent, during development, during etching, during rinsing and the like, the individual stations can be disposed in such a fashion that the fluids are cascaded, i.e. the fluid of a downstream station is subsequently utilized in an upstream station in which e.g. a pre-processing step is effected or another side of the substrate is treated. This advantageously reduces the required amount of fluid.

The fluids can easily be drained to carry off soiling particles along with them. Special turning devices for the wafers are not required inside the processing station, since the wafers enter into and leave the processing station in vertical alignment (e.g. cleaning station).

One can also provide means for removing the wafers from the guide track or outwardly transferring them to a separate processing zone. Further processing or treatment steps which e.g. cannot be carried out in sequentially disposed stations, can be effected in this zone, e.g. the spin drying procedure or the procedures subsequent thereto. The wafer thereby maintains its vertical orientation.

Stations for application of a bonding agent, for processing with photo-resist, protective coatings, compensation coatings, for drying, for development, for rinsing, for wetting processes such as etching and the like, for exposure and t he like are advantageously also provided for. The substrate can be treated in vertical orientation in all of these stations.

A station for brush cleaning can e.g. be provided with which the silicon wafers are set into rotation, with this rotation being supported by driven (rotating) brushes pressing onto the surfaces at both sides, wherein one of the brushes (e.g. a nylon brush or a sponge brush) extends over the entire substrate diameter and the other brush occupies only a portion of the substrate diameter or rotates through only a portion of the substrate diameter, or both brushes can extend through only a fraction of the substrate diameter or rotate through only a fraction of the substrate diameter. The direction of rotation of the brushes is advantageously chosen in such a fashion that the rotation of the wafers is supported.

In brush cleaning, the brushes must be pushed against the substrate surface to a stronger or weaker degree for effecting a cleaning action. This pressing leads to a slowing down of the rotation of the silicon wafer. In order to compensate therefor, the clamping force holding the substrate during processing must be substantially increased. This can, however, damage the crystal structures. One can avoid this problem by rotating the brushes through a partial diameter of the silicon wafer only. In this fashion, the rotational motion of the substrate can be supported. Selection of the brush pressure and their rates of rotation can be used to adjust the cleaning power.

During brushing, water can be sprayed onto the surface of the substrate to dampen the brushes for cleaning.

In particular, the brushes can act through the substrate middle to also clean the center of the substrate, i.e. both brushes extend past the center of the substrate.

A processing station for spin drying can comprise a closed spin chamber which is opened for loading and unloading only. Towards this end, the chamber can e.g. comprise two halves which can be brought together. The substrate is held in the chamber using a gripper (substrate holder) engaging the edges of the substrate. The spun-off water is removed from the spin chamber using a suction device. The station can also be equipped with inlets for dry and/or pre-warmed gas (e.g. nitrogen) to enhance the drying process, since the moisture can thereby be reduced after completion of the rotation in the spin chamber.

Since the guide elements only touch the wafers on the sideward end regions, processing on both sides can be carried out in a straightforward fashion and contamination of the wafers with particles is kept to a minimum. In addition, the mechanical loading of the substrate during processing is accordingly low.

The processing station has tilted tracks for the wafers so that the wafers can roll through the processing station under the force of gravity. Drives are not necessary therefor. The processing station is advantageously equipped with at least one stopper for the wafers so that the wafers (substrates) can have the required or predetermined dwell time in the station. They can subsequently be released for further transport.

Rotational drive elements are advantageously provided within the processing station with which the wafers can be rotated without being transported i.e. they can be rotated about their central axis while within the station.

The device preferentially has a feed station and/or a receiving station which can have a hopper or is configured as such. A plurality of wafers are stored next to each other in the feed station and/or in the receiving station and are individually introduced into the processing stations using a collimator. The wafers can be borne in the hoppers in vertical alignment. The collimator allows only one single wafer at a time to be fed to the feed station or to gain access to the receiving station, wherein the collimator holds back the other wafers in the feed station or in the receiving station.

The feed station and/or the receiving station can be borne for tilting so that the wafers can enter or exit this station under the force of gravity, i.e. the desired wafer falls through the inlet into the station.

The feed station or the receiving station can comprise a plunger for transporting the wafers out of the feed station or the receiving station and into or out of the processing station.

For loading and unloading purposes, the guide elements can be configured in such a fashion that they can be removed from the region of the wafer. This facilitates a sideward loading and unloading of the transport or conveyor belt.

Drying can be effected in an additional downstream part of the rinsing station or can be carried out in a separate station using alcohol steam or Marangoni drying.

Further advantages, features and details of the invention can be extracted from the dependent claims as well as from the following description in which particularly preferred embodiments are described in detail with reference to the drawing. The features shown in the drawing and mentioned in the claims and in the description can be important to the invention individually or collectively in arbitrary combination.

DESCRIPTION OF THE PREFERRED EMBODIMENT

Figure 1:
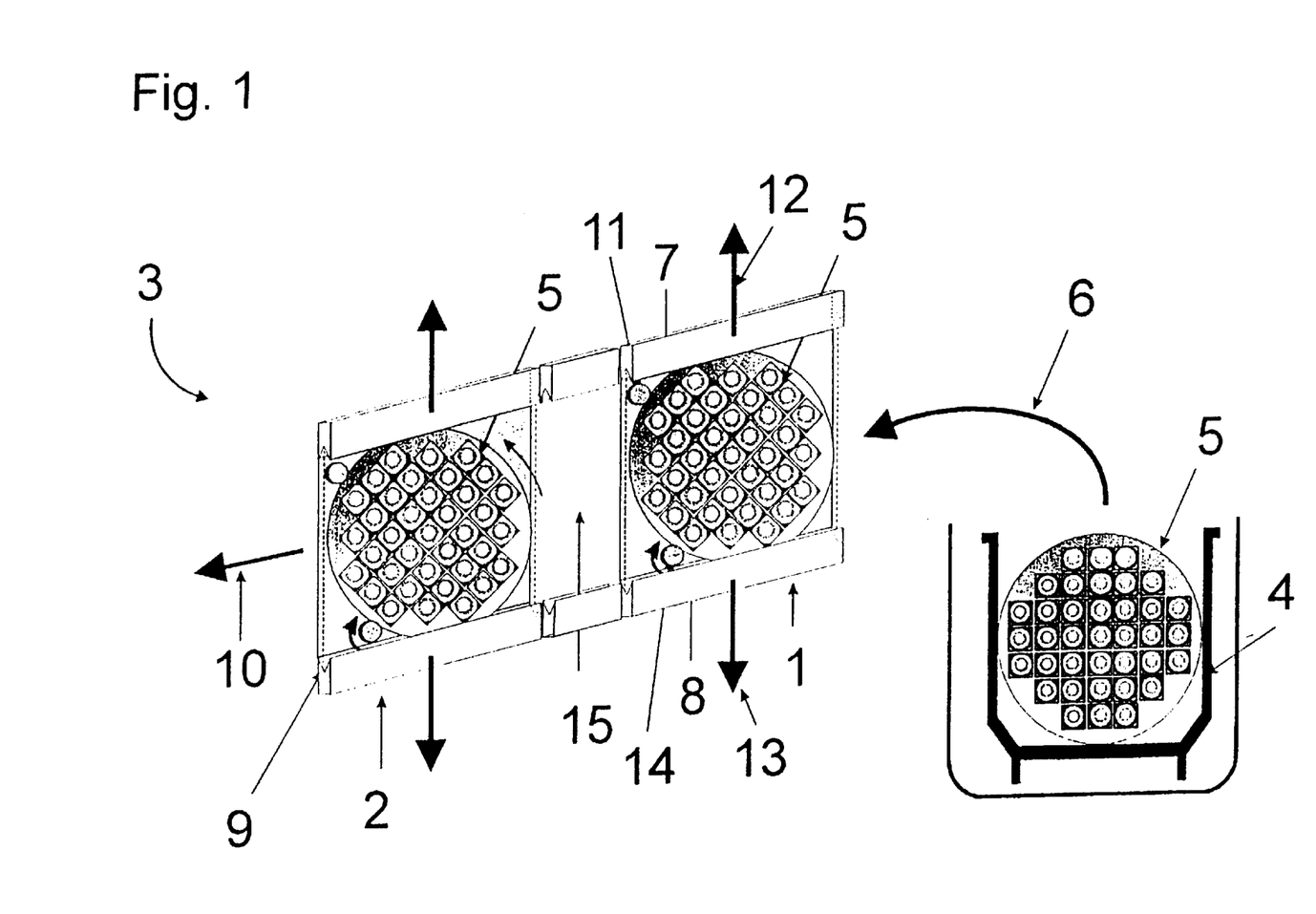
FIG. 1 shows a portion of a processing device having vertically aligned silicon wafers.

FIG. 1 shows two stations 1 and 2 of a processing device 3 as well as a hopper 4 in which the silicon wafers are stored. The silicon wafers 5 are removed from the hopper 4 e.g. through tilting of the hopper 4 in the direction of arrow 6 or by a handling system and are introduced into the first station 1 in vertical alignment. The guide elements 7 and 8 hold the substrate, subsequently referred to as silicon wafer 5, in station 1 at its edges to prevent it from falling over. Since the guide elements 7 and 8 are tilted and since the guide element 8 has a track 9, the silicon wafers 5 roll under the force of gravity in the transport direction, i.e. in the direction of arrow 10. The silicon wafer 5 is held in station 1 by means of a stopper 11 in such a fashion that it can be borne and processed in this position. The silicon wafer 5 can be set into rotation at this location via e.g. a rotational drive element 14 for even processing. Following processing, the station 1 is once more brought into its initial position and the stopper 11 releases the silicon wafer 5 so that it can roll to the next station via an adapter element 15.

Figure 2:
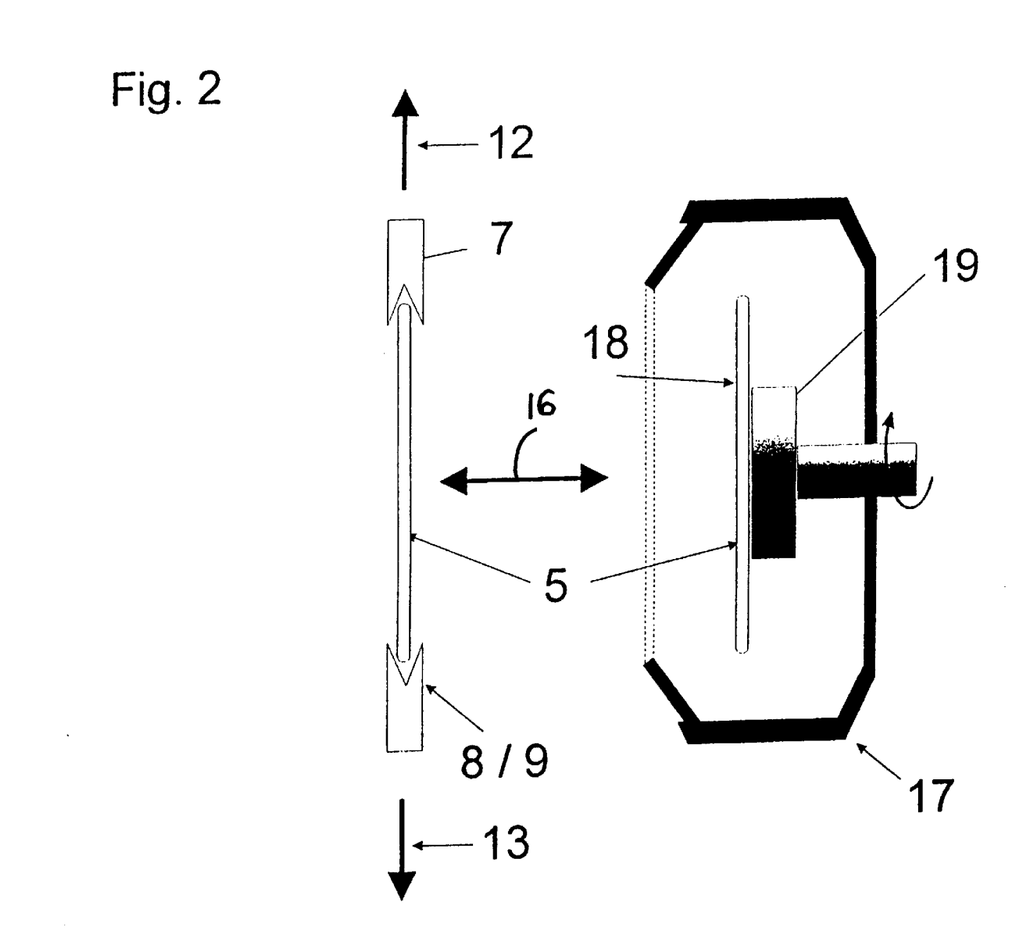
FIG. 2 shows a station in which the substrate passes through a processing stage.

FIG. 2 shows an embodiment of a station e.g. the station 2, wherein the wafer 5 is released following withdrawal of the guide elements 7 and 8 in the direction of arrows 12 and 13, and transported in the direction of arrow 16 into a separate processing zone 17. Fluids can be introduced onto the surface 18 of the substrate in the separate processing zone 17. Towards this end, the substrate is held from behind using e.g. a substrate holder 19 and is set into rotation. Excess fluids are spun off the surface 18. For drying processes, the substrate holder 19 can also be heated. After processing, the substrate holder 19 is displaced and the wafer 5 is fed back into the guide elements 7, 8 so that the wafer 5 can be guided to the next station via the track.

Figure 3:
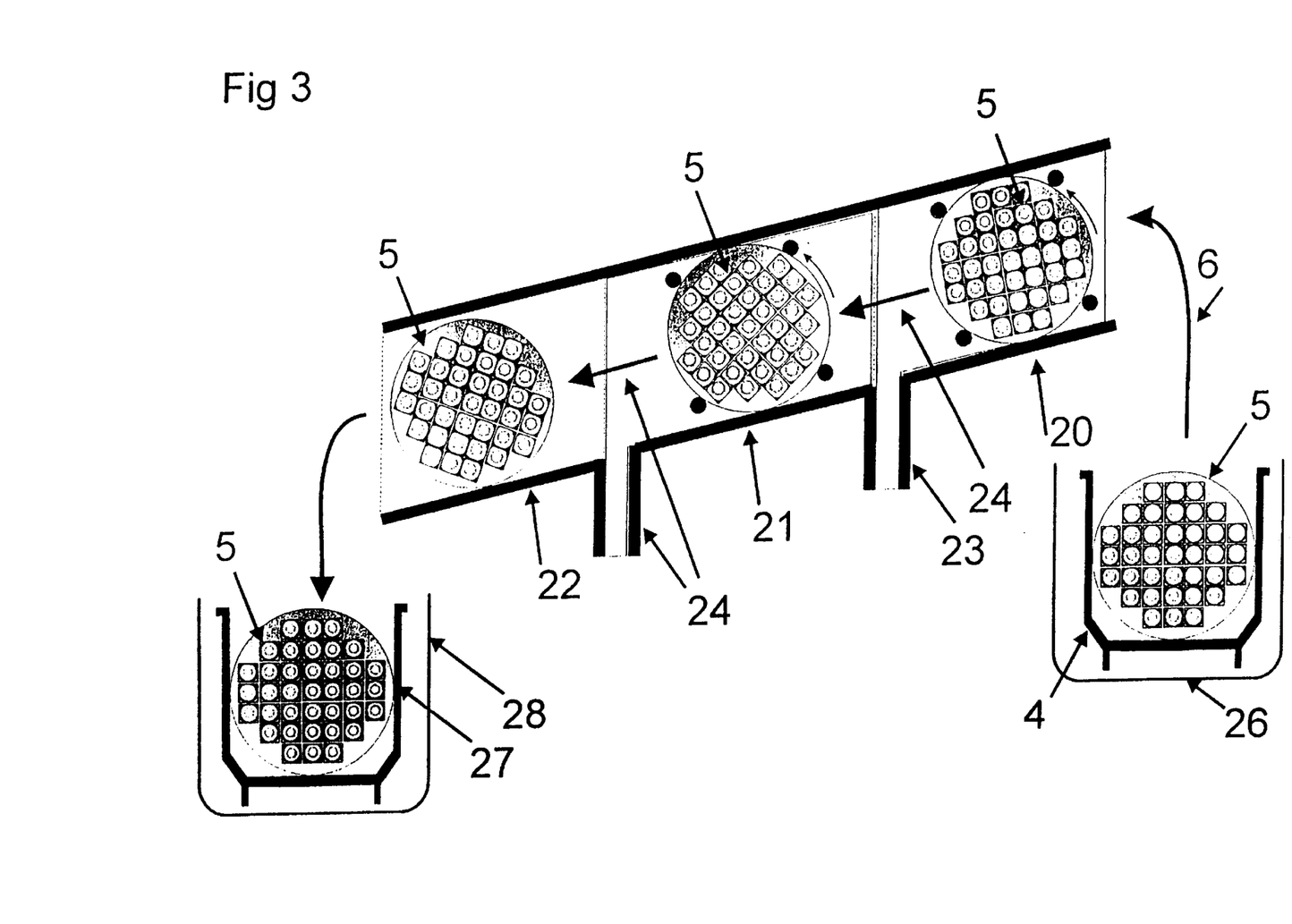
FIG. 3 shows a variation of the device having a feed station and a receiving station.

FIG. 3 shows two cleaning stations 20 and 21 disposed one behind the other, and a rinsing station 22 downstream thereof. The cleaning stations 20 and 21 and the rinsing station 22 are tilted and define a slanted plane on which the silicon wafers 5 can roll under the force of gravity. The silicon wafers 5 thereby pass through the individual cleaning stations 20 and 21 and the rinsing station 22 without additional drive mechanisms. Each cleaning station 20 or 21 has a drain 23 or 24 for draining off the cleaning fluid (e.g. de-ionized water, with or without chemical additives, or the like). As can be seen in FIG. 3, the cleaning stations 20 and 21 are disposed one behind the other so that the cleaning fluid flowing through the drain 24 can once more be used in cleaning station 20, i.e. in the upstream cleaning station. This reduces the amount of cleaning fluid used.

A hopper 4, having a feed station 26, is disposed in an upstream transport direction (arrow 24) in front of the cleaning station 20 for introducing the silicon wafers 5 to the cleaning station 20 in the direction of arrow 6. The rinsing station 22 has an additional downstream hopper 27 having a receiving station 28. The receiving station 28 can also be configured as a drying station.

Figure 4:
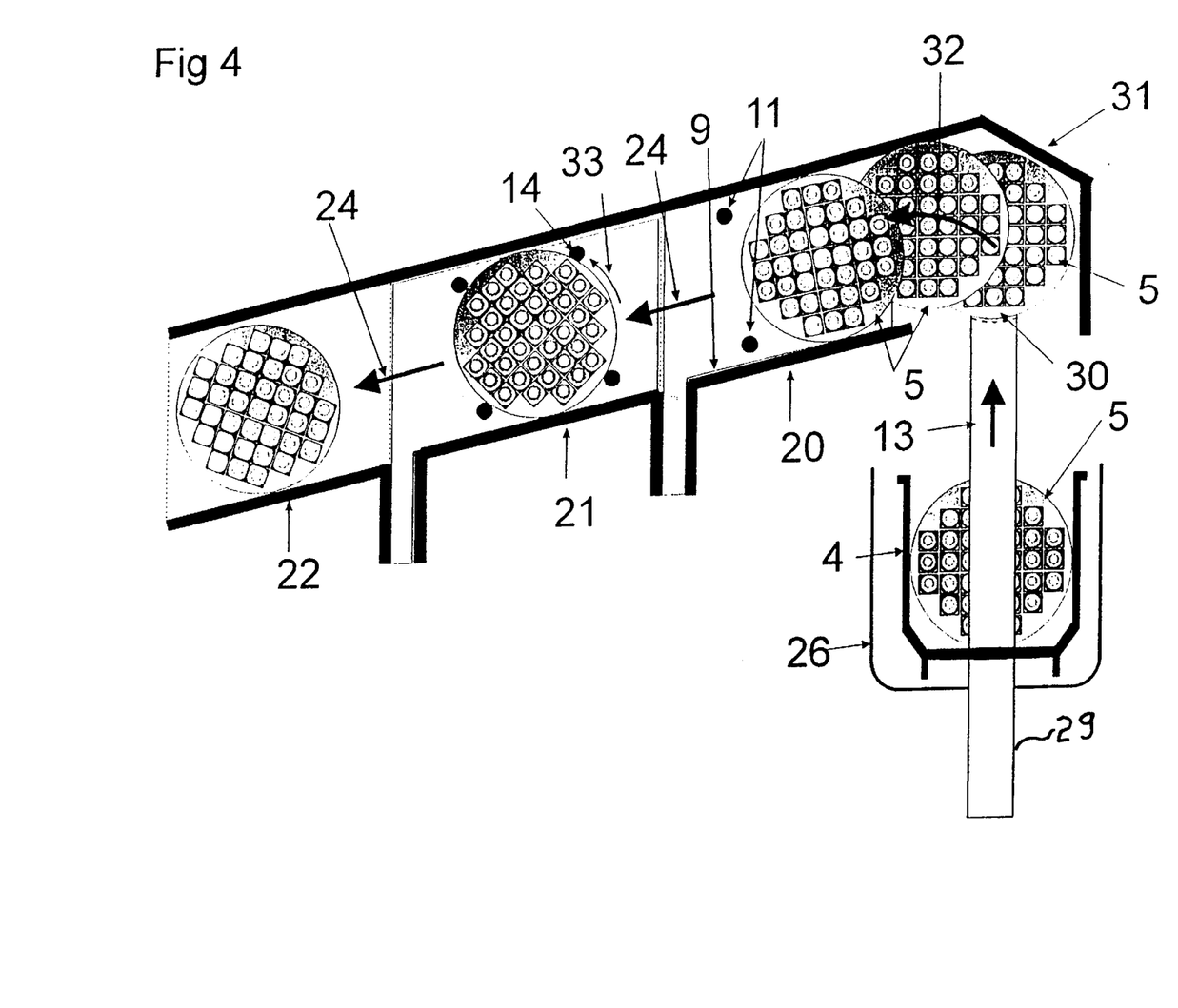
FIG. 4 shows an additional variation having a feed station comprising a plunger.

FIG. 4 shows a variation in which the silicon wafers 5 are transported out of the hopper 4, in particular out of the feed station 26, and into the cleaning station 20. The feed station 26 thereby has a transport plunger 29 which can be moved in the vertical direction. The upper end 30 of this transport plunger 29 has a suitable receptacle or holding device for the silicon wafer 5. The transport plunger 29 removes the silicon wafer 5 from the hopper 4 and transports it in a vertical, upward direction. The silicon wafer 5 thereby abuts at its upper peripheral edge on a slanted surface 31, wherein a further upward motion of the transport plunger 29 in the direction of arrow 32 pushes it away therefrom. The silicon wafer 5 thereby enters into the cleaning station 20 and rolls on the tilted track 19 until it is held by stoppers 11. Both sides of the silicon wafer 5 are cleaned at this position. The cleaning station 21 also has rotational drive elements 14 which rotate the silicon wafer 5 in the direction of arrow 33. This can also be done in station 20.

Figure 5:
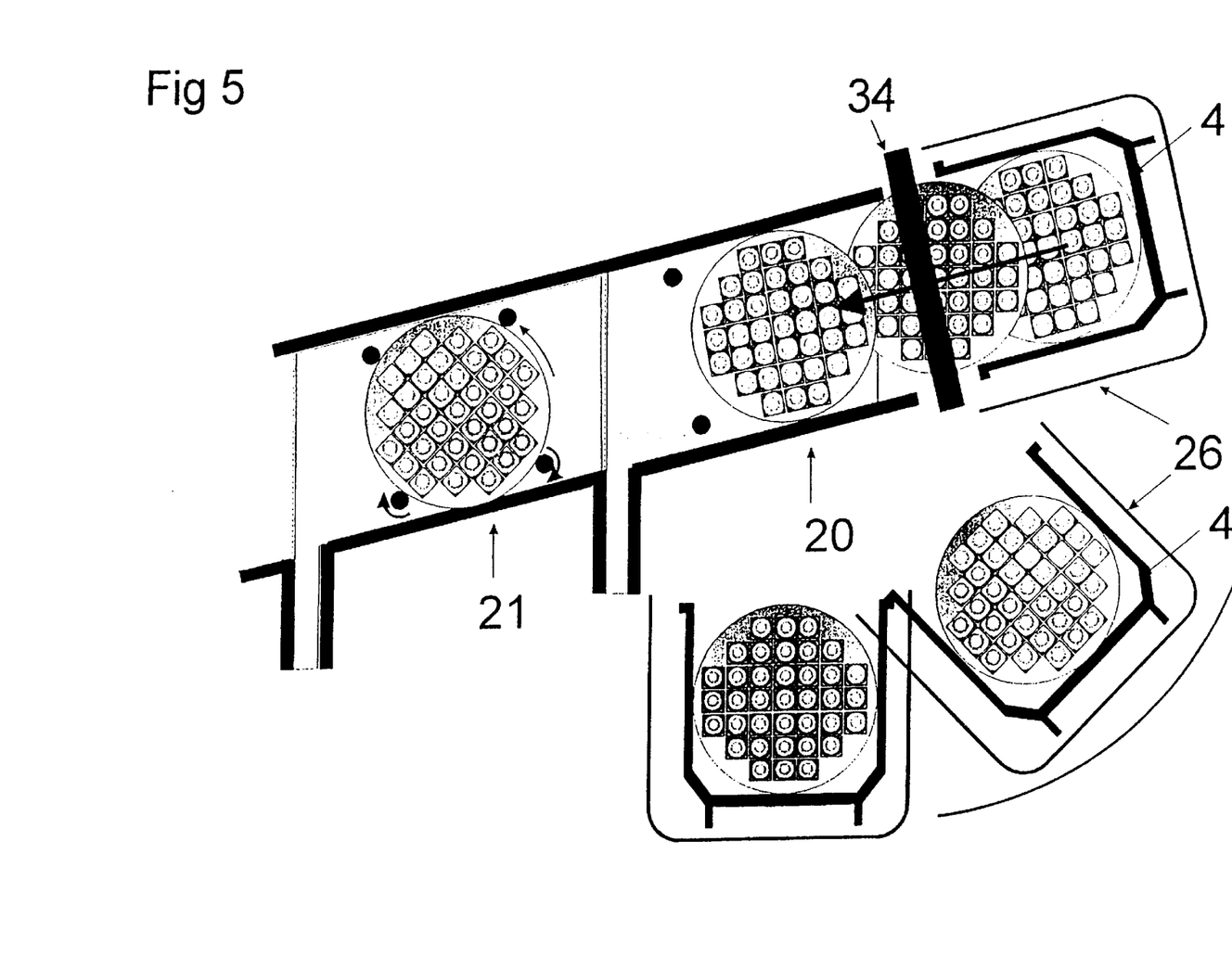
FIG. 5 shows a variation of the device having a feed station which can be tilted.

FIG. 5 shows another variation for supplying the cleaning station 20. In this embodiment, the hopper 4 is disposed in such a fashion that the silicon wafer 5 leaves the hopper 4 and the feed station 26 under the force of gravity and enters into the cleaning station 20. The collimator 34 only passes the desired silicon wafer 5 to assure that only this desired silicon wafer 5 leaves the feed station 26, while blocking the remaining wafers in the feed station 26.

Figure 6:
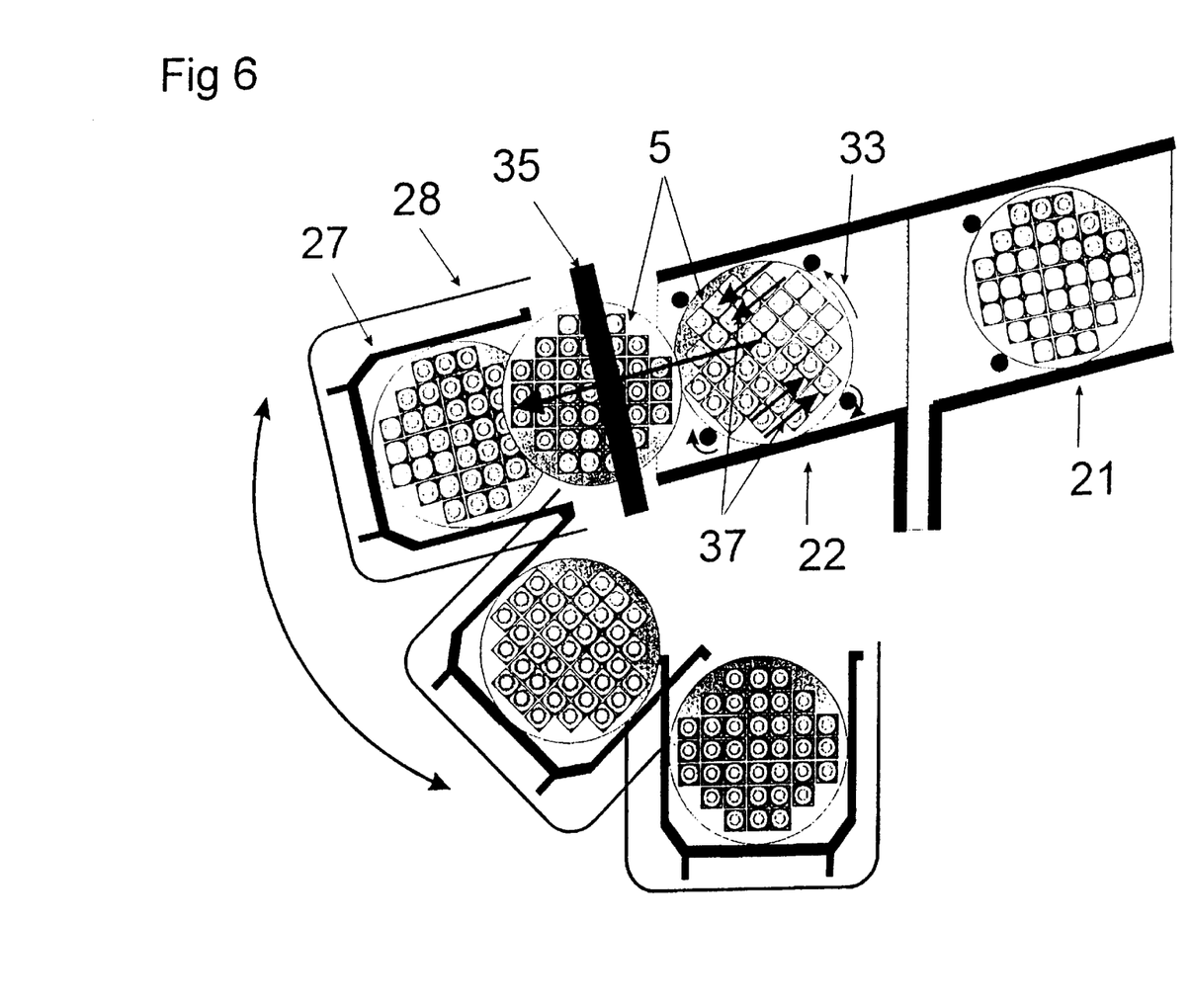
FIG. 6 shows a variation of the receiving station, configured for tilting.

The silicon wafers 5 pass through collimator 35 into a corresponding magazine 27, borne for pivoting and having a receiving station 28, downstream of the rinsing station 22 (FIG. 6).

Figure 7:
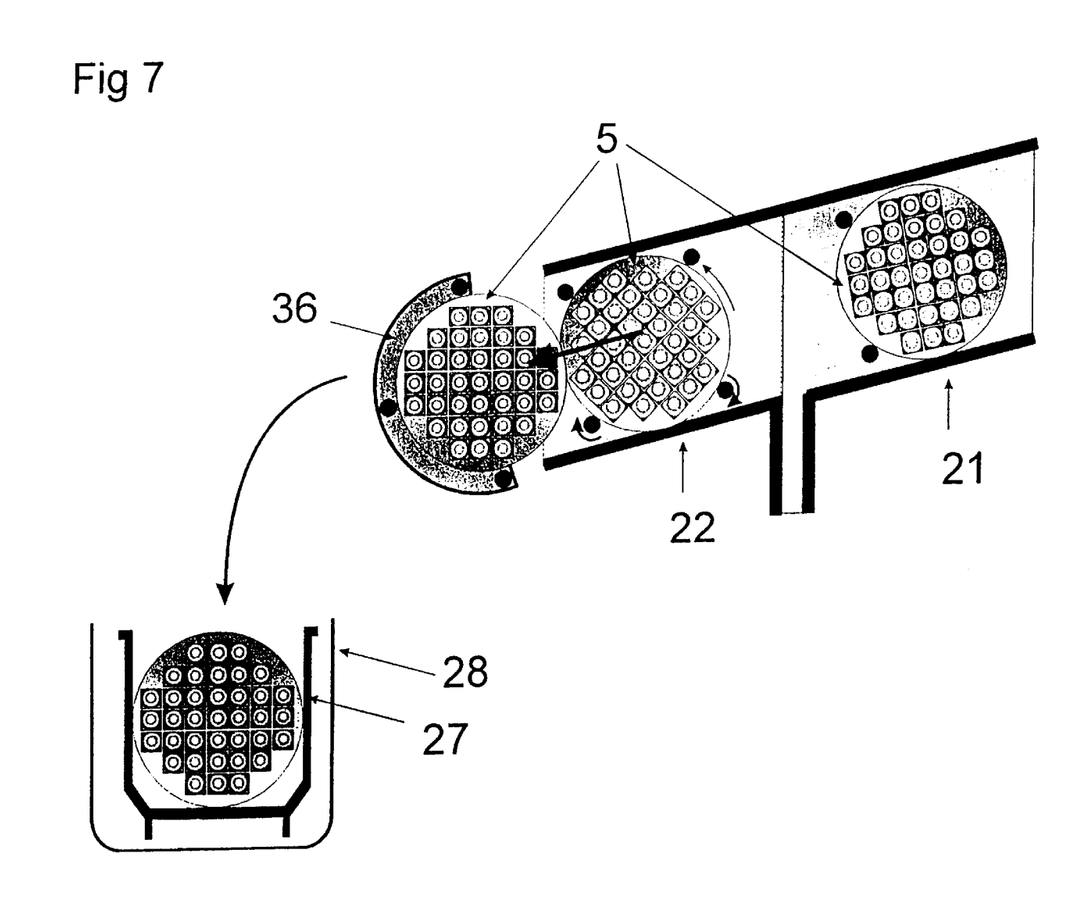
FIG. 7 shows an additional variation of the receiving station in which the wafer is introduced using a transport element.

Alternatively, as shown in FIG. 7, the wafer 5 leaving the rinsing station 22 can also be grasped by a gripper 36 and separated off into the receiving station 28 of the hopper 27.

Arrows 37, shown in the rinsing station 22 of FIG. 6, indicate a flow direction of rinsing liquid on the wafer 5. The wafer 5 can thereby be set into rotation to circulate in the direction of arrow 33.

Figure 8:
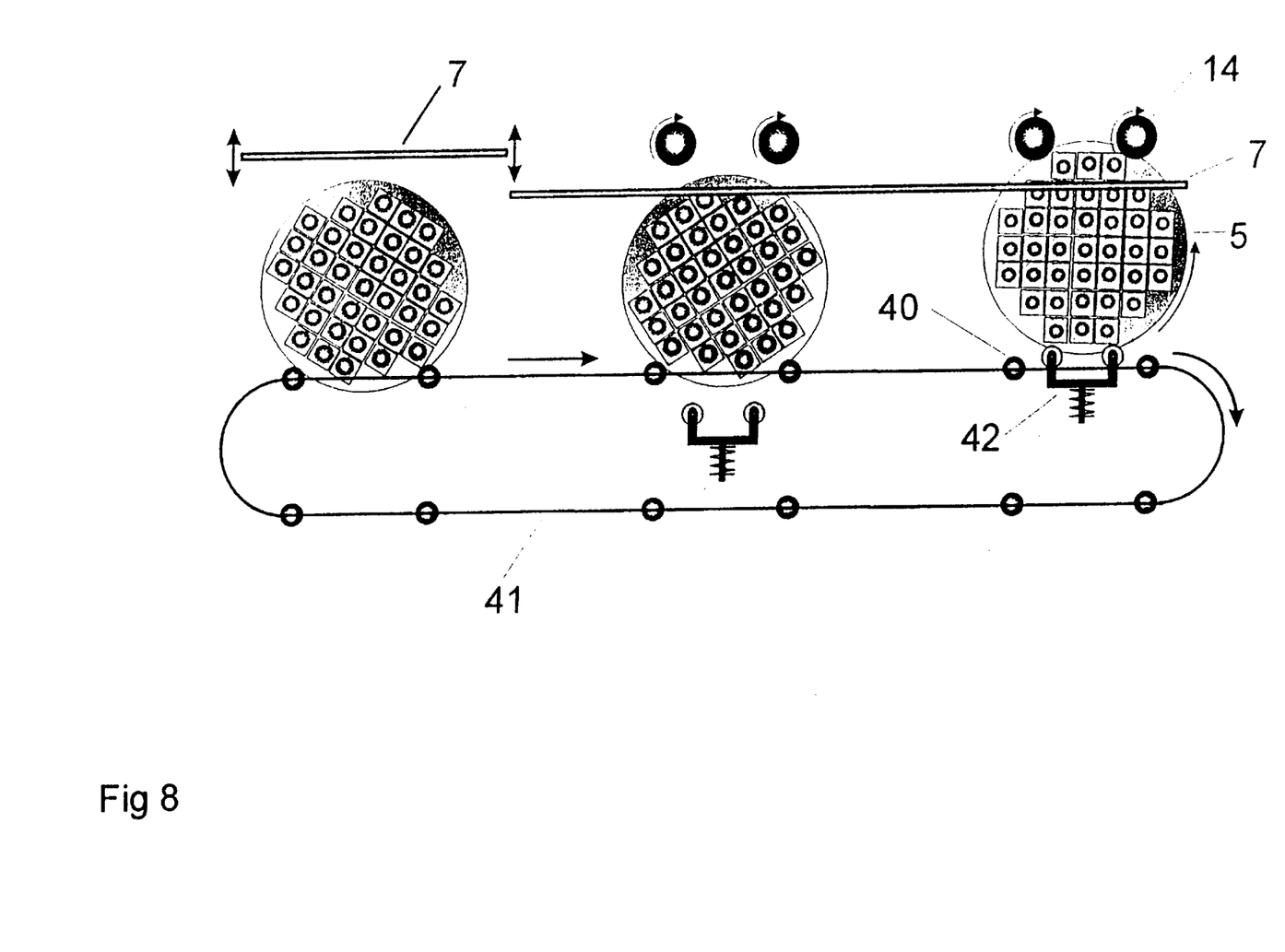
FIG. 8 shows a configuration of the substrate transport having a rotational drive device.

FIG. 8 shows a transport device for substrate transport, wherein the silicon wafer 5 is moved by transport rollers 40 disposed at "separations" on a transport belt 41. The transport rollers 40 are disposed in such a fashion that a silicon wafer 5 is always borne between two transport rollers 40 with the spacing to the next transport roller 40 remaining free. In this fashion, a minimal bearing surface for the substrate 5 is obtained. The sideward guiding of the wafer 5 is effected by guide elements 7 which are configured in this embodiment as guides strips. For processing, the substrate 5 is lifted from below off of the transport belt 41 using spring loaded rollers 42 which serve as a lifting mechanism to bring the silicon wafer 5 out of contact with the transport rollers 40. Drive rollers 14, functioning as rotational drive elements 14, are disposed across from the rollers 42 to set the silicon wafer 5 into rotation. These drive rollers 14 are pressed against the silicon wafer 5 with the pressing force being regulated by opposing spring loading. The guiding strip can be displaced in an upward direction for loading and unloading the transport belt 41 to allow sideward removal of the silicon wafers from the transport belt 41.

Figure 9:
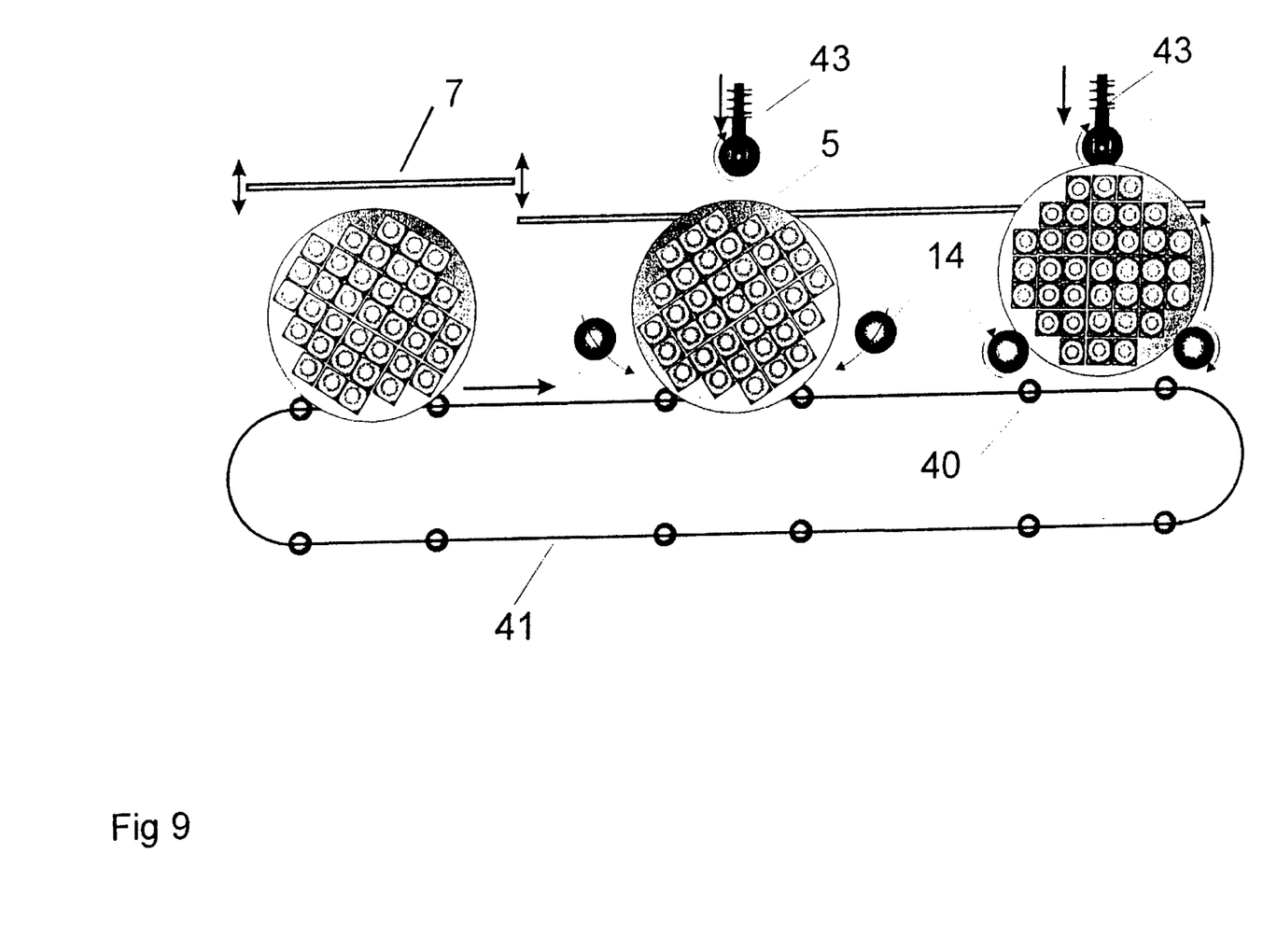
FIG. 9 shows a configuration of the substrate transport device having an alternative rotational drive device.

FIG. 9 shows an alternative configuration, wherein the silicon wafers 5 are set into rotation by drive rollers 14, serving as rotational drive elements, which can be displaced towards each other to clamp the substrate 5 between them and lift it off the transport belt 40 and out of engagement with the transport rollers 40. An additional spring loaded guide roller 43 is disposed opposite the drive rollers 14 and can be displaced towards the substrate 5. This three point bearing holds the silicon wafer during processing.

Figure 10:
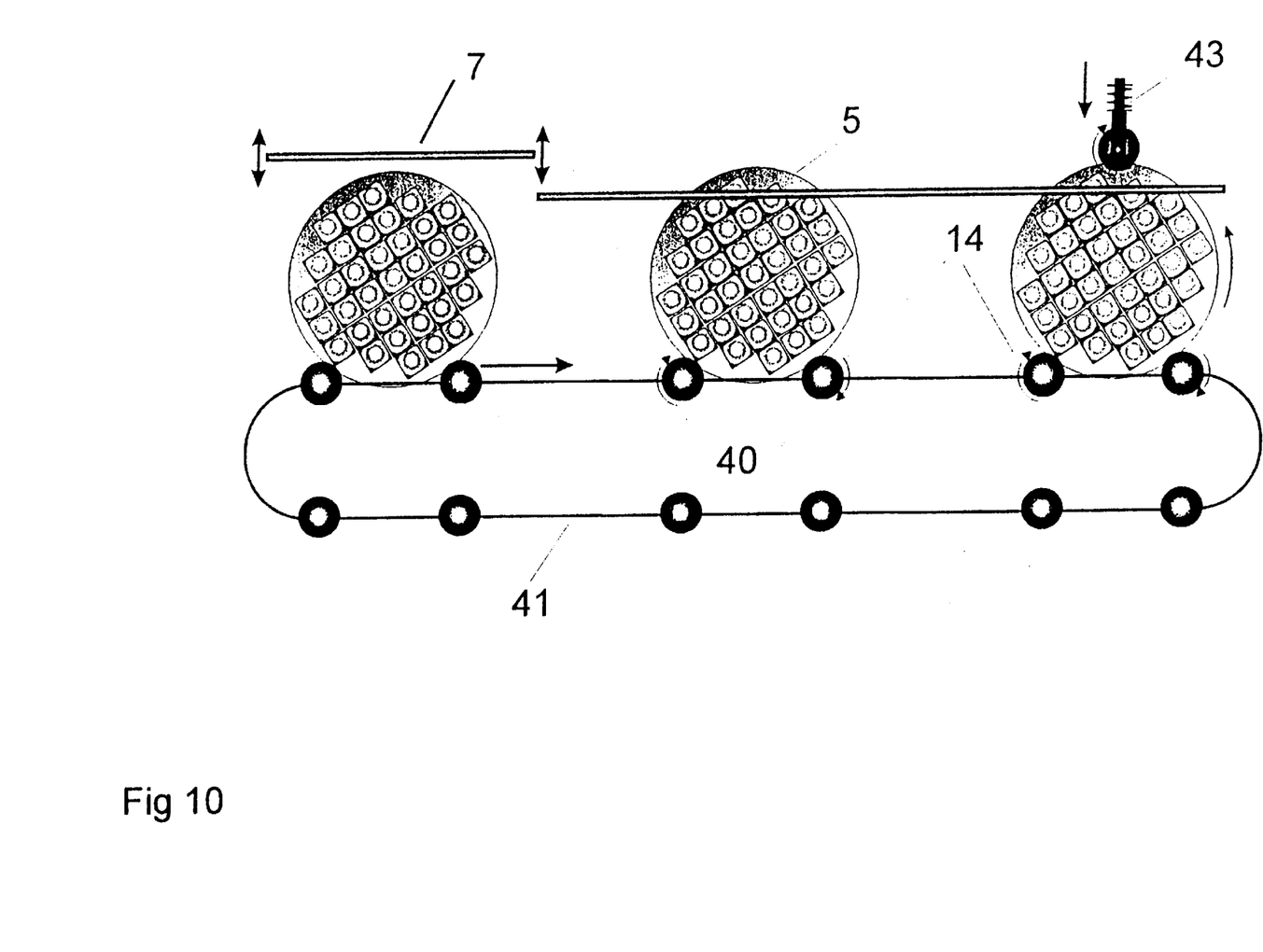
FIG. 10 shows a configuration of the substrate transport device with which the transport rollers are configured as rotational drive elements.

FIG. 10 shows an additional configuration of the invention, wherein the transport rollers 40 are configured as rotation drive elements 14. The bearing of the wafers 5 and their rotational drive is effected by means of the third roller 43 which can be displaced towards the wafer 5 to clamp the silicon wafer 5 in a resilient fashion.

The wafer can seat on the rotational drive element 14 under the force of its own weight only and be held at the side without contact e.g. by means of fluid jets.

Figure 11:
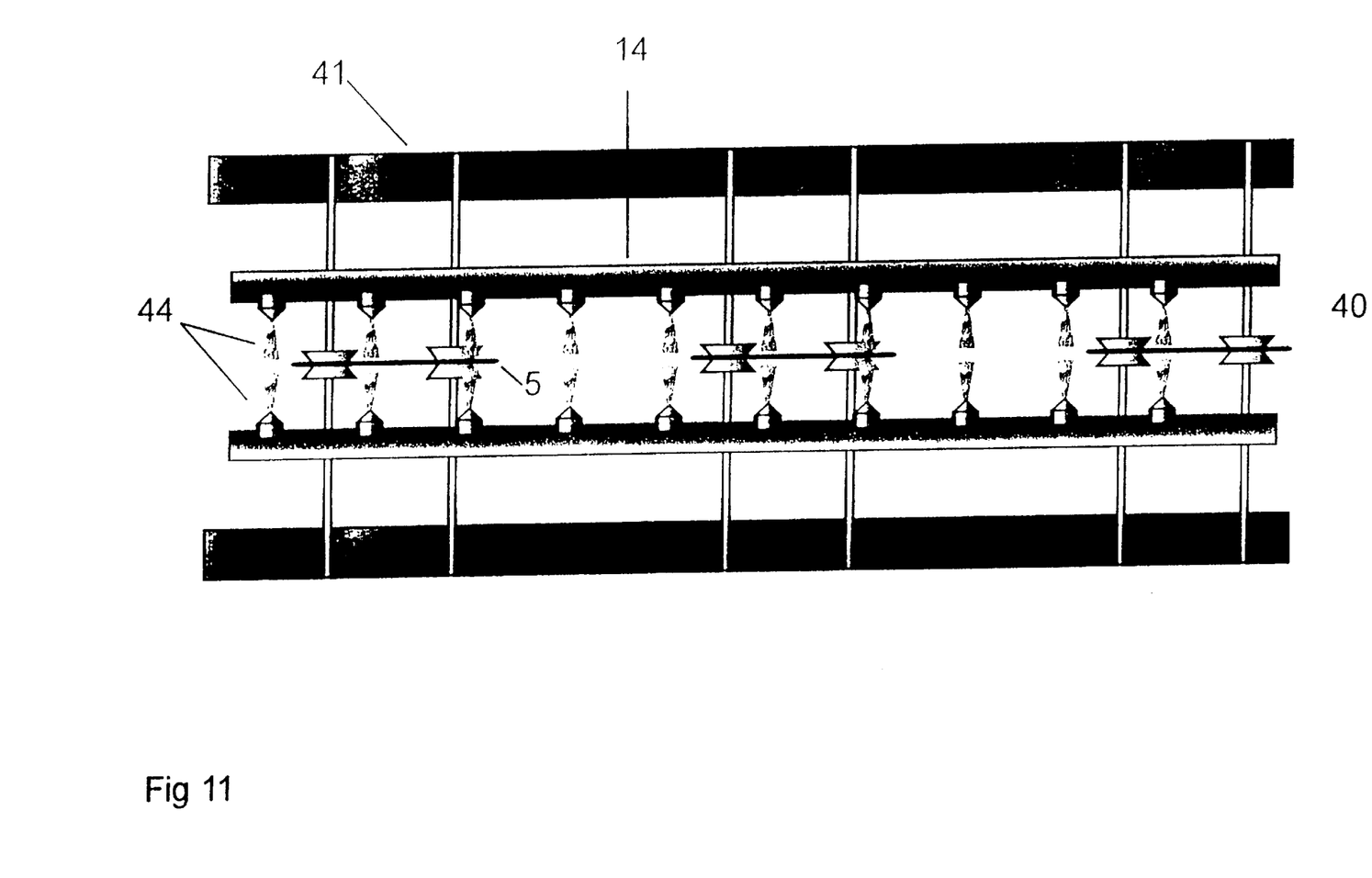
FIG. 11 shows a device for guiding the silicon wafers without contact.

Finally, FIG. 11 shows guiding of the silicon wafers 5 without contact using spray nozzles 44.

Figure 12:
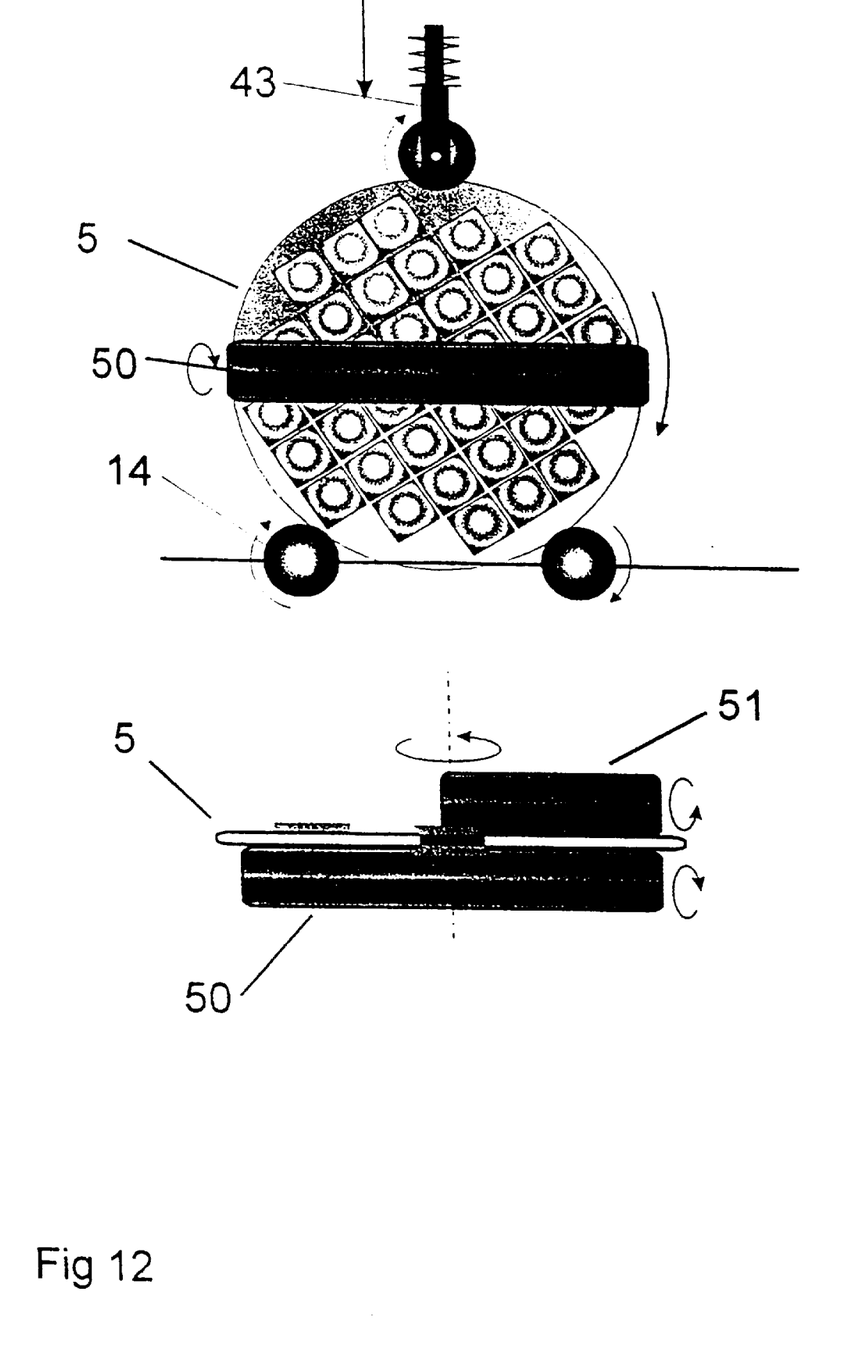
FIG. 12 shows a cleaning station equipped with brushes.

Brushes 50, 51 can be used to clean the substrate 5, acting on the rotating silicon wafer 5 (FIG. 12). The brushes 50, 51 can be nylon or sponge brush rollers. The brushes 50, 51 rotate for cleaning and are pressed against the silicon wafers 5 with a certain amount of pressure. In consequence thereof, the rotation of the wafer 5 is slowed. In order to prevent this and to support rotation of the silicon wafers 5, only one of the brushes 50 rotates or extends across the entire substrate diameter. The other brush 51 extends or rotates only through a portion of the substrate diameter, wherein this brush 51 also extends past the middle of the substrate to guarantee cleaning of the substrate center. Moreover, the sense of rotation of the brushes 50, 51 is chosen in such a fashion as to support rotation of the wafer 5.

Figure 13:
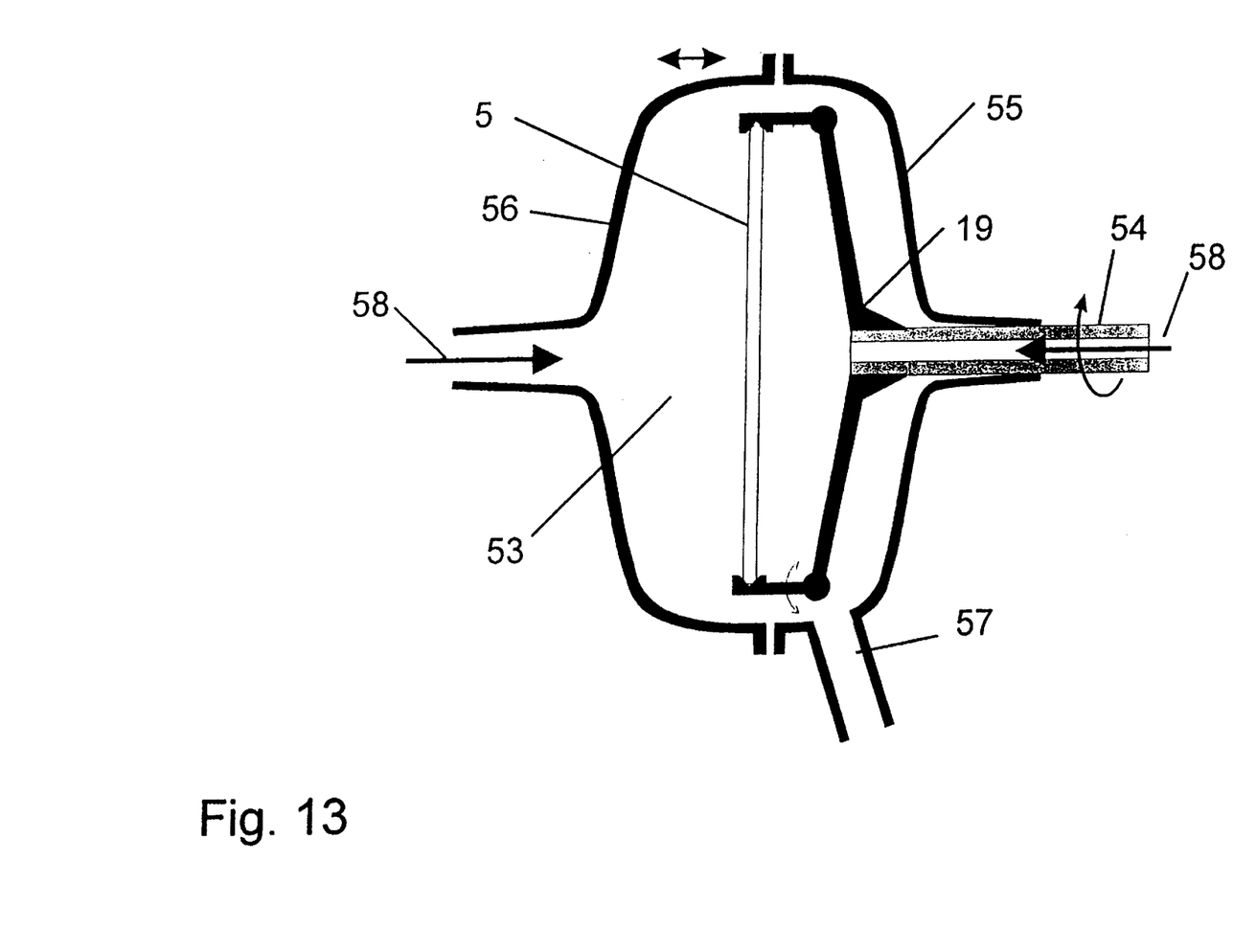
FIG. 13 shows a drying device having a spin chamber.

Finally, FIG. 13 shows a drying station for spin drying with which the substrate 5 is held at its edge regions within the closed spin chamber 53 by a gripper 19. The gripper 19 can be driven by a shaft 54. The spin chamber 53 consists essentially of two halves 55 and 56 which can be separated for loading and unloading. The substrate 5 is rotated for drying. The centrifugal forces acting on the middle of the substrate are supported by gravity which likewise acts on the water droplets located on substrate 5. In order to reduce the surface tension of the water, an alcohol-gas mixture is introduced into the spin chamber 53 so that an alcohol atmosphere is present therein. Rotation drives the water off the surface of the substrate 5, and it is suctioned off through a drain 57 by a suctioning device. This also reduces the overpressure. Before rotation is ended, the spin chamber 53 is opened to reduce the moisture in the spin chamber 53 and to completely dry the substrate 5. Optionally, a pre-warmed, dry gas can be introduced into the spin chamber 53 through the inlets 58 to accept residual moisture.

What is claimed is:

1. A method for processing flat substrates and silicon wafers for the manufacture of microelectronic components, the method comprising the steps of;
    a) aligning the flat substrates in a substantially vertical plane; and
    b) passing the substrates through at least one processing station following step a) by tilting said processing station to at least one of pass and roll the substrates under a force of gravity.

2. The method of claim 1, wherein at least one of steps a) and b) comprise transport by a handling robot.

3. The method of claim 1, wherein step b) comprises transporting the substrates using at least one of transport rollers and transport elements mounted to a transport belt, wherein the substrates are borne between two transport rollers or two transport elements.

4. The method of claim 1, wherein step b) comprises passing the substrates through a plurality of processing stations.

5. The method of claim 1, wherein step b) comprises at least one of stopping and rotating the substrates during processing.

6. The method of claim 1, wherein step b) comprises one of passing the substrates through said processing station on a substrates edge and receiving the substrates in a circular adapter.

7. The method of claim 1, wherein step b) comprises at least one of drying the substrates, treating the substrates with emulsions for photolithographic processes, and cleaning the substrates using fluid media introduced onto at least one surface of the substrates.

8. The method of claim 1, wherein step b) comprises bearing the substrates on a rotational drive under a force of gravity and holding the substrates with a clamping device.

9. The method of claim 7, wherein the substrates are dried with a vertical spin drying procedure and further comprising introducing a gas-alcohol mixture into said processing station to produce an alcohol atmosphere.

10. A device for processing flat substrates and silicon wafers for the manufacture of microelectronic components, the device comprising:

means for aligning the flat substrates in a substantially vertical plane;

means for passing the substrates through at least one processing station in a vertical aligned orientation; and means for tilting said processing station to at least one of pass and roll the substrates under a force of gravity.

11. The device of claim 10, wherein said passing means comprises guide elements for guiding the substrates in vertical alignment.

12. The device of claim 11, wherein said guide elements comprise fluid spray nozzles on both sides of the substrates to guide the substrates without contact.

13. The device of claim 11, wherein said guide elements comprise at least one of guide rollers and guide strips, wet with liquid and disposed on both sides of the substrates wherein the substrates contact a liquid film only.

14. The device of claim 10, wherein said tilting means comprises a tilting guide track for the substrates.

15. The device of claim 10, further comprising a plurality of processing stations disposed one behind the other and means for transporting a processing fluid in a cascaded fashion from a downstream processing station to an upstream processing station.

16. The device of claim 10, further comprising means for removing the substrates from a guiding track and for introducing the substrates to at least one of a separate processing zone and a separate processing station.

17. The device of claim 10, further comprising at least one of means for application of a bonding agent, means for application of a photo-resist charge, means for layer coatings, means for compensation layer coatings, means for drying, means for development, means for rinsing, means for wetting processes, means for etching and means for exposure.

18. The device of claim 10, further comprising a cleaning station having rotating brushes disposed on both sides of the substrates, wherein the substrates rotate and one of said brushes extends across an entire diameter of the substrates and another brush extends through a portion of a substrates diameter.

19. The device of claim 10, further comprising a cleaning station having two rotating brushes disposed at both sides of the substrates and means for rotating the substrates, wherein said two brushes extend over only a fraction of a substrates diameter.

20. The device of claim 10, further comprising a cleaning station having two brushes extending past a center of the substrates.

21. The device of claim 11, wherein said guide elements only touch the substrates on side and end regions thereof.

22. The device of claim 10, wherein said processing station comprises at least one of a substrates stopper and a substrates rotational drive element.

23. The device of claim 10, wherein said passing means comprises a feed station and a receiving station.

24. The device of claim 23, wherein at least one of said feed station and said receiving station comprises a hopper for holding the substrates in vertical orientation.

25. The device of claim 23, wherein at least one of said feed station and said receiving station comprises a transport plunger for at least one of transporting the substrates into and transporting the substrates out of said processing station.

26. The device of claim 23, wherein said tilting means comprises means for tilting at least one of said feed station and said receiving station.

27. The device of claim 10, wherein the substrates seat on a rotational drive under a force of gravity.

* * * * *